United States Patent
Perault et al.

(10) Patent No.: US 7,017,489 B2
(45) Date of Patent: Mar. 28, 2006

(54) METHODS AND APPARATUS FOR CHANGING WEB MATERIAL IN A STENCIL PRINTER

(75) Inventors: Joseph A. Perault, Natick, MA (US); Randy L. Peckham, North Scituate, RI (US); Gary T. Freeman, Attleboro, MA (US); Frank John Marszalkowski, Jr., Cumberland, RI (US)

(73) Assignee: Speedline Technologies, Inc., Franklin, MA (US)

( * ) Notice: Subject to any disclaimer, the term of this patent is extended or adjusted under 35 U.S.C. 154(b) by 0 days.

(21) Appl. No.: 10/784,122

(22) Filed: Feb. 20, 2004

(65) Prior Publication Data

US 2005/0183600 A1    Aug. 25, 2005

(51) Int. Cl.
*B41F 35/00*    (2006.01)

(52) U.S. Cl. .................. 101/425; 101/129; 101/423; 400/692; 15/103.5

(58) Field of Classification Search .............. 101/129, 101/423, 424, 425; 400/692; 15/103.5
See application file for complete search history.

(56) References Cited

U.S. PATENT DOCUMENTS

| | | | |
|---|---|---|---|
| 5,150,650 A * | 9/1992 | Murakami | 101/425 |
| 5,275,104 A * | 1/1994 | Corrado et al. | 101/425 |
| 5,491,871 A | 2/1996 | Reber et al. | |
| 5,537,924 A * | 7/1996 | Krause | 101/423 |
| 5,918,544 A | 7/1999 | Doyle | |
| 5,991,963 A | 11/1999 | Tourigny | |
| 6,036,787 A | 3/2000 | Bennett et al. | |
| 6,041,711 A * | 3/2000 | Oyaizu et al. | 101/425 |
| 6,412,414 B1 | 7/2002 | Loos | |
| 6,491,204 B1 | 12/2002 | Erdmann | |
| 6,626,106 B1 | 9/2003 | Peckham et al. | |
| 6,638,363 B1 | 10/2003 | Erdmann | |

FOREIGN PATENT DOCUMENTS

DE        42 15 355 A1    11/1993

(Continued)

OTHER PUBLICATIONS

International Search Report for PCT/US2005/004908 mailed Jul. 12, 2005.

*Primary Examiner*—Andrew H. Hirshfeld
*Assistant Examiner*—Jill E. Culler
(74) *Attorney, Agent, or Firm*—Lowrie, Lando & Anastasi, LLP

(57) ABSTRACT

A quick-change material module of a stencil wiper assembly for wiping a stencil of a stencil printer includes a supply roller to receive a roll of material, a take-up roller to receive used material, and a drive to move the material across the stencil between the supply roller and the take-up roller. The supply roller is designed to move between an operating position in which the module functions to wipe the stencil and a changing position in which the supply roller is accessible to change the roll of material. A pivot mechanism is further disclosed for pivoting the supply roller between the operating and changing positions. A frame supports the supply roller, the take-up roller, and the drive. The pivot mechanism includes at least one pivot arm having one end rotatably attached to the supply roller and an opposite end pivotably attached to the frame. A method for changing a roll of material within a quick-change material module of a stencil wiper assembly designed to wipe a stencil of a stencil printer is further disclosed.

13 Claims, 8 Drawing Sheets

FOREIGN PATENT DOCUMENTS

| | | |
|---|---|---|
| EP | 0 315 144 A2 | 5/1989 |
| EP | 0 755 782 A2 | 1/1997 |
| EP | 1 186 408 A1 | 3/2002 |
| WO | WO 03/084757 A1 | 10/2003 |

* cited by examiner

METHODS AND APPARATUS FOR CHANGING WEB MATERIAL IN A STENCIL PRINTER

This application relates to U.S. patent application Ser. No. 10/784,121 entitled SELF-CONTAINED VACUUM MODULE FOR STENCIL WIPER ASSEMBLY by Joseph Perault and William Claiborne, filed on even date herewith, and U.S. patent application Ser. No. 10/784,123 entitled METHODS AND APPARATUS FOR CLEANING A STENCIL by Joseph Perault and William Claiborne, filed on even date herewith. Both of these related applications are incorporated herein by reference.

BACKGROUND OF INVENTION

1. Field of Invention

The present invention relates generally to stencil cleaning methods and apparatus, and more particularly to a stencil printer having a stencil wiper assembly designed to enable an operator to quickly replace a used supply of web material, such as a roll of paper, with a new supply of web material.

2. Discussion of Related Art

In a typical surface-mount circuit board manufacturing operation, a stencil printer is used to print solder paste onto a circuit board having a pattern of pads or some other conductive surface onto which solder paste will be deposited. The circuit board is automatically fed into the stencil printer and one or more small holes or marks on the circuit board, called fiducials, is used to properly align the circuit board with the stencil or screen of the stencil printer prior to the printing of solder paste onto the circuit board. Once a circuit board has been properly aligned with the stencil in the printer, the circuit board is raised to the stencil, solder paste is dispensed onto the stencil, and a wiper blade or squeegee traverses the stencil to force the solder paste through apertures formed in the stencil and onto the board. As the squeegee is moved across the stencil, the solder paste tends to roll in front of the blade, which desirably causes mixing and shearing of the solder paste so as to attain desired viscosity to facilitate filling of the apertures in the screen or stencil. The solder paste is typically dispensed onto the stencil from a standard cartridge.

A disadvantage associated with the prior art wiper systems is that the web material supply, i.e., the roll of paper, may be difficult to access and therefore difficult to replace. There is presently a need for a stencil wiper system that enables the operator to quickly and efficiently replace the paper supply upon its depletion. There is also a need for a stencil wiper system that is compact in size, thereby reducing the overall footprint of the stencil printer.

SUMMARY OF INVENTION

Embodiments of the invention provide improvements to stencil wiper systems, such as those described above.

A first aspect of the invention is directed to a quick-change material module of a stencil wiper assembly for wiping a stencil of a stencil printer. The module includes a supply roller to receive a roll of material, a take-up roller to receive used material, and a drive to move the material across the stencil between the supply roller and the take-up roller. The supply roller is constructed and arranged to move between an operating position in which the module functions to wipe the stencil and a changing position in which the supply roller is accessible to change the roll of material.

Another aspect if the invention is the provision of pivot mechanism for pivoting the supply roller between the operating and changing positions and a frame to support the supply roller, the take-up roller, and the drive. Specifically, the pivot mechanism includes at least one pivot arm having one end rotatably attached to the supply roller and an opposite end pivotably attached to the frame. The pivot mechanism further includes a cam member provided on one end of the supply roller and a cam slot provided on the frame to receive the cam member therein. The frame is constructed and arranged to enable the module to move linearly with respect to the wiper assembly, with the cam member following along in the cam slot upon movement of the module to pivot the supply roller from the operating position to the changing position.

In another aspect of the present invention, the pivot mechanism includes an actuator for effecting the pivoting of the supply roller between the operating and changing positions. The actuator has a piston assembly having one end pivotably attached to the pivot arm and an opposite end secured to the frame.

In still another aspect of the present invention, a method for changing a roll of material within a quick-change material module of a stencil wiper assembly designed to wipe a stencil of a stencil printer is further disclosed. The method includes moving the material between a supply roller and the take-up roller, and pivoting the supply roller between an operating position in which the module functions to wipe the stencil and a changing position in which the supply roller is accessible to change the roll of material.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
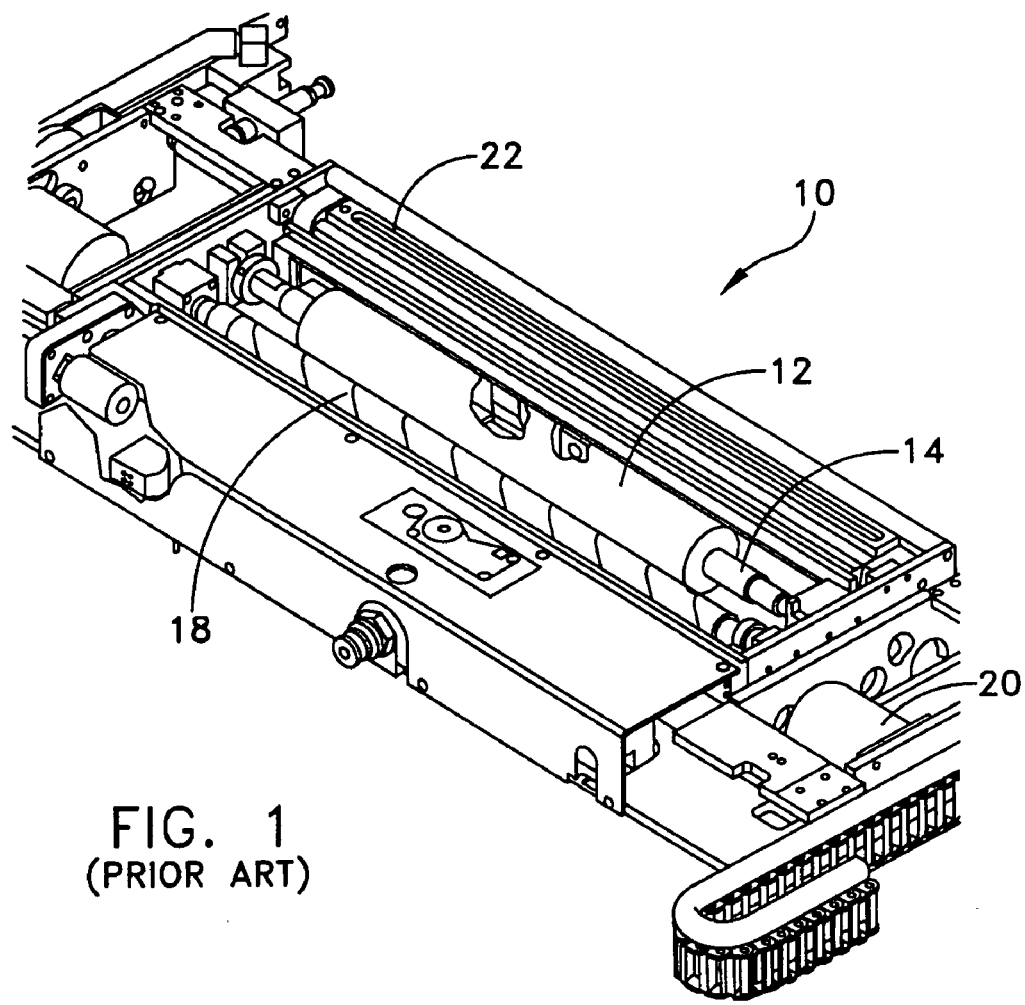
FIG. 1 shows perspective view of a prior art stencil wiper apparatus.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

For purposes of illustration, embodiments of the present invention will now be described with reference to a stencil printer used to print solder paste onto a circuit board. One skilled in the art will appreciate, however, that embodiments of the present invention are not limited to stencil printers that print solder paste onto circuit boards, but rather, may be used in other applications requiring dispensing of other viscous materials, such as glues and encapsulents. Further, stencil printers in accordance with embodiments of the present invention are not limited to those that print solder paste on circuit boards, but rather, include those used for printing other materials on a variety of substrates. Also, the terms screen and stencil may be used interchangeably herein to describe a device in a printer that defines a pattern to be printed onto a substrate.

Figure 3:
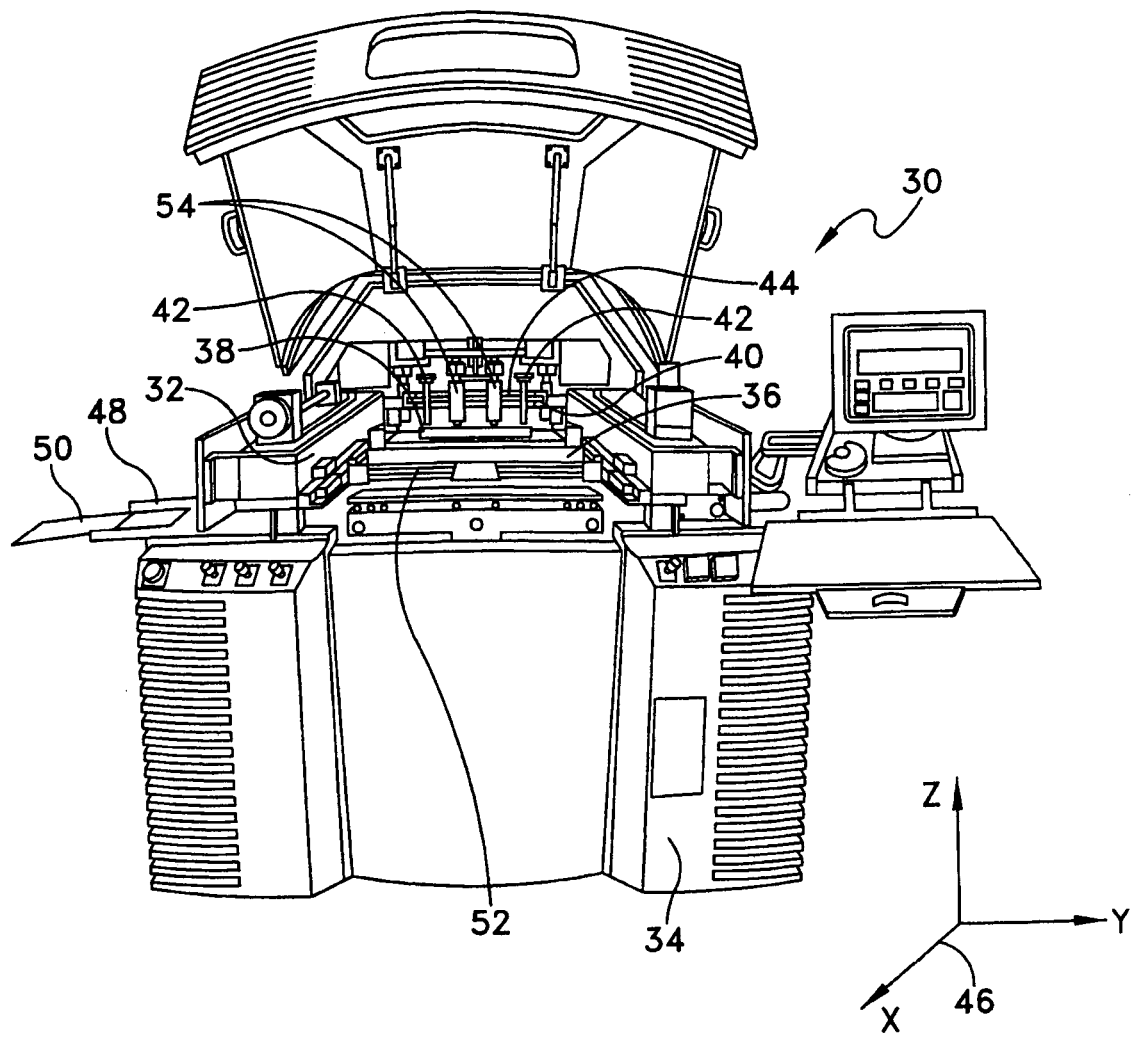
FIG. 3 shows a front elevational view of a stencil printer in which an embodiment of the present invention is implemented.

FIG. 3 shows a stencil printer, generally indicated at 30, including a frame 32 that supports components of the stencil printer including a controller 34, a stencil 36, and a dispensing head 38 having a dispensing slot from which solder paste may be dispensed. The dispensing head 38 is coupled to a first plate 40 using two thumbscrews, each indicated at 42. The first plate 40 is coupled to a second plate 44 which is coupled to the frame 32 of the stencil printer 30. The first plate 40 is coupled to the second plate 44 in such a manner that the first plate 40 can be moved with respect to the second plate 44 along a z axis, the z axis being defined by the coordinate axis system indicated at 46. The first plate 40 is moved by motors under the control of the controller 34.

The second plate 44 is movably coupled to the frame 32 such that the second plate 44 can move with respect to the frame 32 along an x axis, the x axis also being defined by the coordinate axis system 46. As described below in further detail, the movements of the first and second plates 40, 44 allow the dispensing head 38 to be placed over the stencil 36 and moved across the stencil 36 to allow printing of solder paste onto a circuit board.

Stencil printer 30 also includes a conveyor system having rails 48 for transporting a circuit board 50 to a printing position in the stencil printer 30. The stencil printer 30 has a number of pins 52, positioned beneath the circuit board 50 when the circuit board 50 is in the dispensing position. The pins 52 are used to raise the circuit board 50 off of the rails 48 to place the circuit board 50 in contact with, or in close proximity to, the stencil 36 when printing is to occur.

The dispensing head 38 is configured to receive two standard three ounce or six ounce solder paste cartridges 54 that provide solder paste to the dispensing head 38 during a printing operation. Each of the solder paste cartridges 54 is coupled to one end of a pneumatic air hose. As readily understood by those skilled in the art, the dispensing head 38 could be adapted to receive other standard, or non-standard, cartridges. The other end of each of the pneumatic air hoses is attached to a compressor that under the control of the controller 34 provides pressurized air to the cartridges 54 to force solder paste to flow from the cartridges 54 into the dispensing head 38 and onto the stencil 36. Mechanical devices, such as a piston, may be used in addition to, or in place of, air pressure to force the solder paste from the cartridges 54 into the dispensing head 38. The controller 34 is implemented using a personal computer having a Microsoft DOS or Windows NT operating system with application specific software to control the operation of the stencil printer 30.

The stencil printer 30 operates as follows. A circuit board 50 is loaded into the stencil printer 30 using the conveyor rails 48. The dispensing head 38 is then lowered in the z direction until it is in contact with the stencil 36. Pressurized air is provided to the cartridges 54 while the dispensing head 38 is moved in the x direction across the stencil 36. The pressurized air forces solder paste out the cartridges 54, and creates pressure on the solder paste in the dispensing head 38, thereby forcing solder paste from the dispensing slot of the dispensing head 38 through apertures in the stencil 36 and onto the circuit board 50. Once the dispensing head 38 has fully traversed the stencil 36, the circuit board 50 is lowered back onto the conveyor rails 48 and transported from the printer 30 so that a second circuit board may be loaded into the printer. To print on the second circuit board, the dispensing head 38 is moved across the stencil 36 in the direction opposite to that used for the first circuit board. Alternatively, a squeegee arm could swing in to contain the solder paste in the dispenser, and the dispenser can then be lifted in the z direction and moved back to its original position to prepare to print on the second circuit board using a similar direction stroke.

Figure 4:
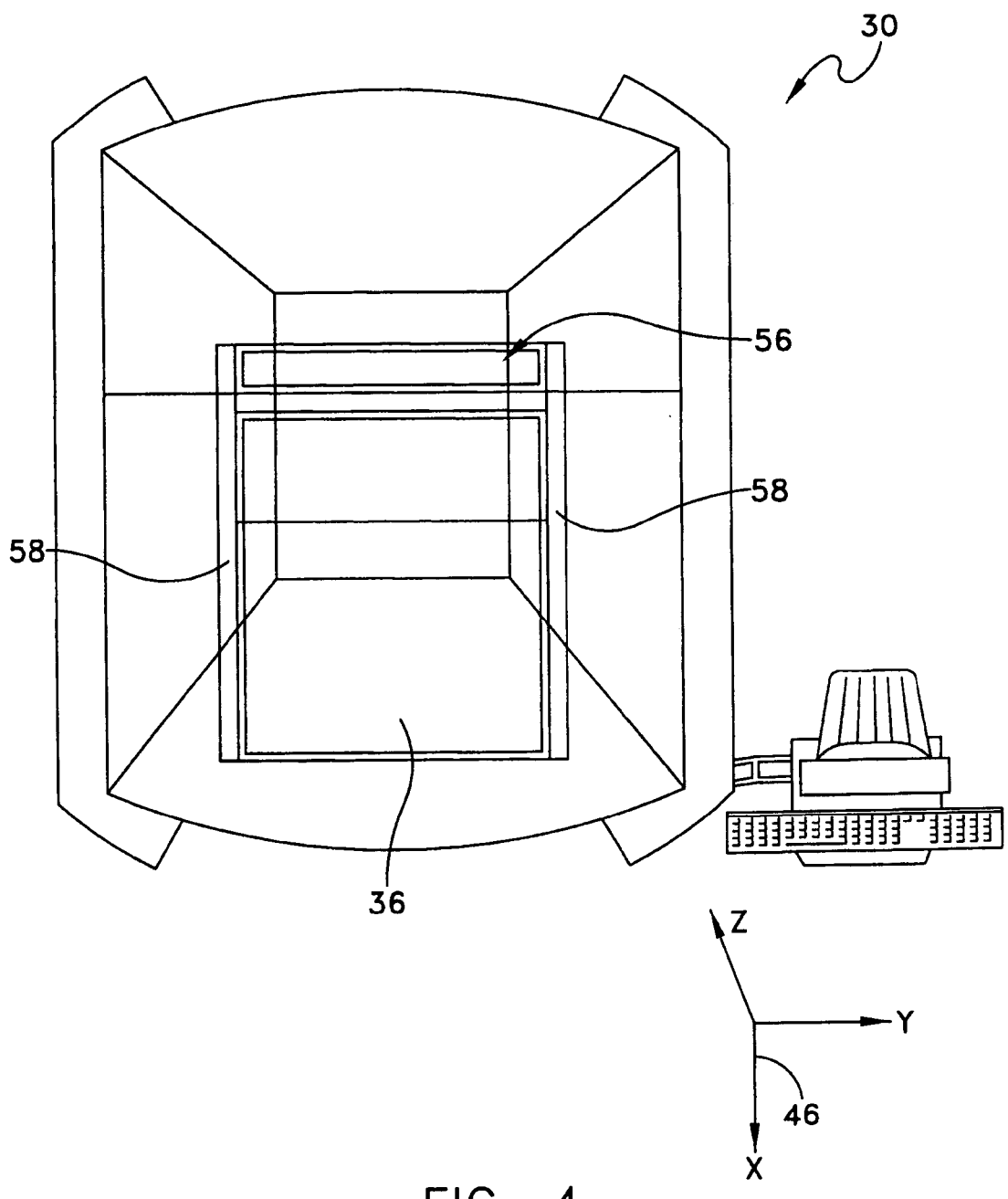
FIG. 4 shows a top plan view of the stencil printer illustrated in FIG. 1 showing a stencil wiper apparatus in accordance with an embodiment of the present invention.

After one or more applications of the solder paste to the circuit boards, excess solder paste may accumulate at the bottom of the stencil 36 and a stencil wiper assembly moves beneath the stencil 36 to remove the excess solder paste. In other embodiments, the stencil 36 may be moved over the stencil wiper assembly. FIG. 4 is a top view of the stencil printer shown in FIG. 3 showing a stencil wiper assembly, generally indicated at 56, in accordance with the invention. The stencil wiper assembly 56 is mounted on a pair of rails, each indicated at 58, and situated at one end of the stencil. According to one embodiment of the invention, the stencil wiper assembly 56 rides on linear rails 58 and is moved back and forth using a rack and pinion mechanism. Alternatively, a motor and belt, mechanism may be used to reciprocate the stencil wiper assembly 56, as well as chain and pulley linear motor, or by an alternative mechanism. The stencil wiper assembly 56 may also stay stationary as the stencil 36 is moved over the assembly 56 to perform the cleaning operation.

Figure 5:
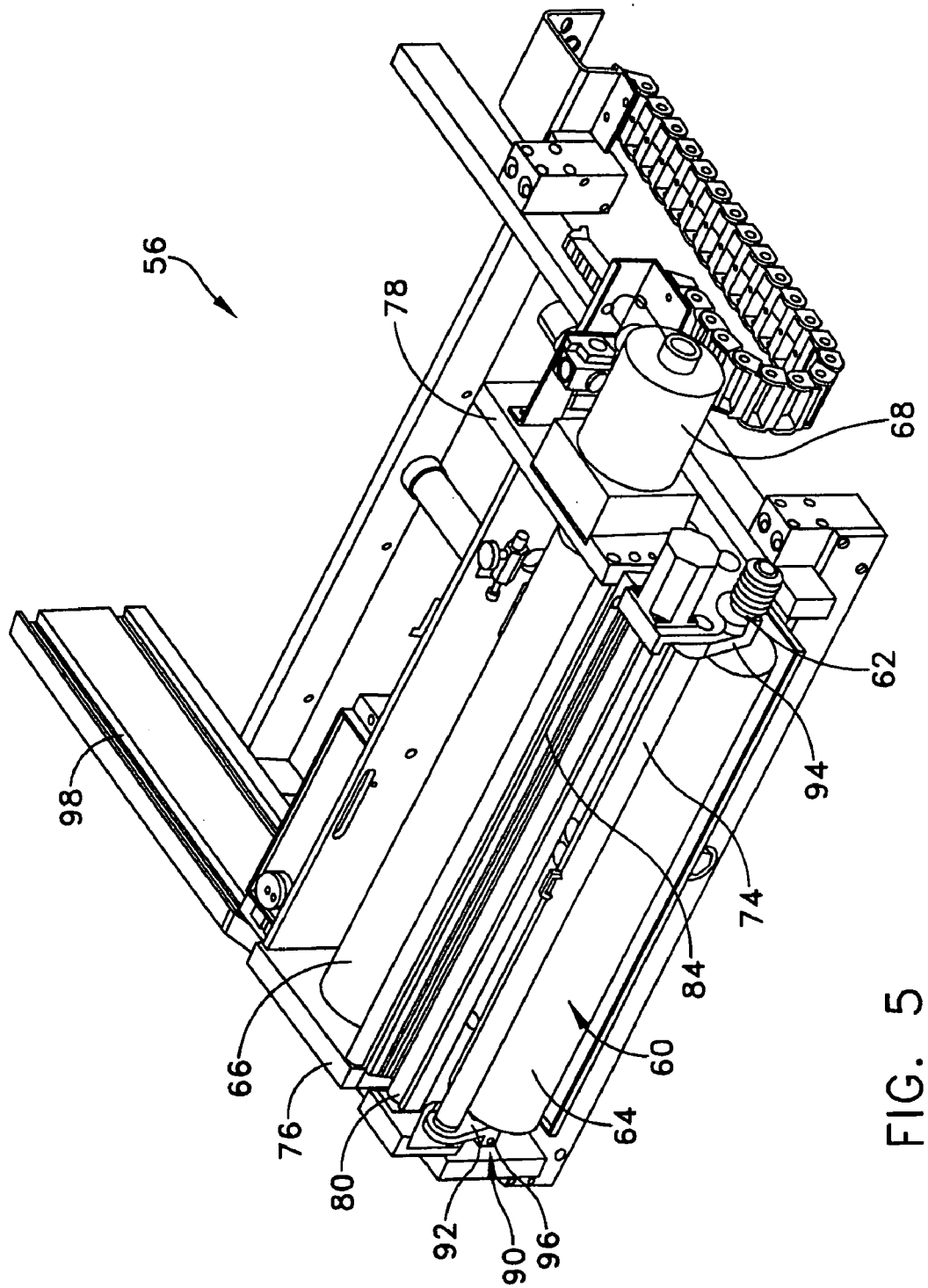
FIG. 5 shows a perspective view of the stencil wiper apparatus having a quick-change web material module of the present invention depicted in an operating position.
Figure 6:
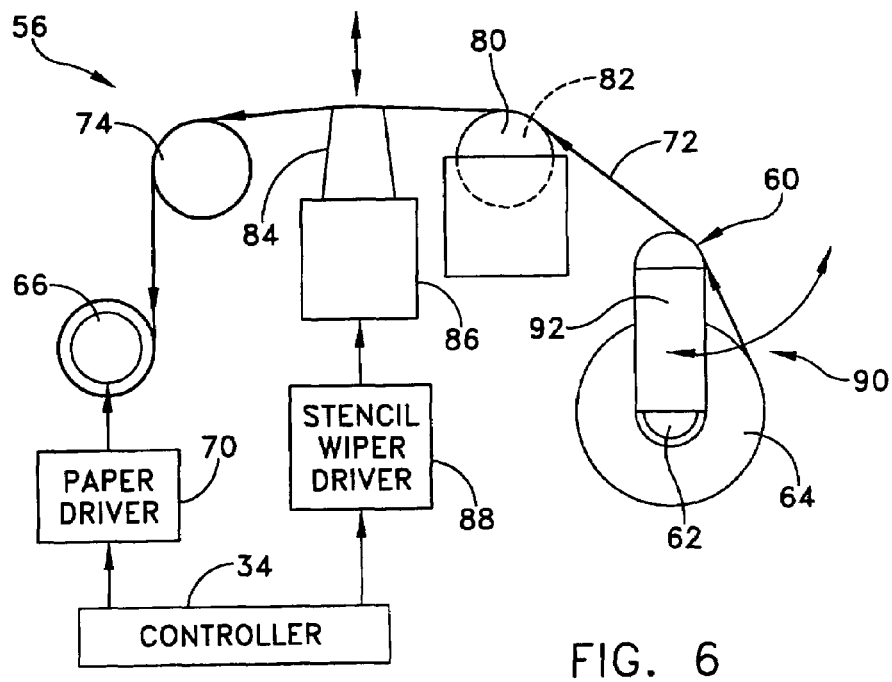
FIG. 6 shows a diagrammatic representation of the quick-change web material module depicted in the operating position.

Referring to FIGS. 5 and 6, which show the stencil wiper assembly in greater detail, there is generally indicated at 60 a web material (paper) supply module of the present invention for enabling an operator to quickly replace the paper supply. As shown, the module 60 includes a supply roller 62 for receiving a roll of paper 64 and a take-up roller 66 for receiving the used paper after it cleans the underneath of the stencil 36. The supply roller 62 is constructed and arranged to receive the roll of paper 64 over the supply roller 62 in a secure position with respect to the supply roller 62. The roller of paper 64 may be purchased from any vendor of such materials, such as from JNJ Industries, Inc. of Franklin, Mass. It should be understood that even though the term "paper" is being used to describe the material used to wipe the stencil, any suitable material capable of wiping the stencil is contemplated.

A paper winder motor 68 having a paper driver 70 is mechanically connected to the take-up roller 66 to rotate the take-up roller 66 in the direction depicted by arrows 72 in FIG. 6. The paper driver 70 communicates with the controller 34 of the stencil printer 30 to move paper from the supply roller 62 to the take-up roller 66 over at least one guide roller 74. A pair of frame members 76, 78 are further provided to support the various components of the paper supply module 60 in the manner illustrated in FIG. 5. It should be noted that in FIGS. 5 and 7 the web of paper is not shown to extend over the guide roller 74 as well as other components of the stencil wiper assembly 56 to more clearly illustrate these components.

The stencil wiper assembly 56 further includes a fluid delivery assembly embodying a hollow solvent tube 80 with numerous small openings 82 formed along the length of the tube 80 for wetting the paper and a wiper blade 84 having a vacuum plenum 86 for removing excess moisture and hardened solder paste from the paper as it travels underneath the stencil. As shown, between the wiper blade 84 and the take-up roller 66 is the guide roller 74. The stencil wiper assembly 56 is designed to move the wiper blade 84 between a non-engaged position in which the paper is spaced away from the stencil 36 to an engaged position in which the wiper blade 84 forces the paper upwards (FIG. 7) to engage the stencil 36 for cleaning the stencil. The controller 34 sends a signal to a stencil wiper driver 88 to move the stencil wiper 84 (and vacuum plenum 86) to its engaged and non-engaged positions. During a cleaning operation, the paper winder motor 68 rotates the paper supply roller 62 by driving the take-up roller 66. The paper passes over the solvent tube 80, which is filled with solvent by a solvent pump (not shown). The release of solvent on the paper is achieved by providing solvent under pressure within the solvent tube 80, which causes the solvent tube to squirt solvent through its numerous holes 82 onto the paper as it passes the solvent tube. Another approach to wetting the paper is by providing a cylindrical structure that rotates within a solvent bath to wet the paper as it travels over the cylindrical structure. Either way, the solvent impregnated paper is passed over the wiper blade 84, which holds the paper in place as the stencil wiper assembly 56 moves underneath the stencil 36 or as the stencil 36 moves over the stencil wiper assembly 56, as the case may be, thereby cleaning the stencil 36.

It should be understood that detailed descriptions of the operation of the fluid delivery assembly (i.e., the hollow solvent tube 80) and the vacuum plenum 86 can be found in the related applications.

Figure 8:
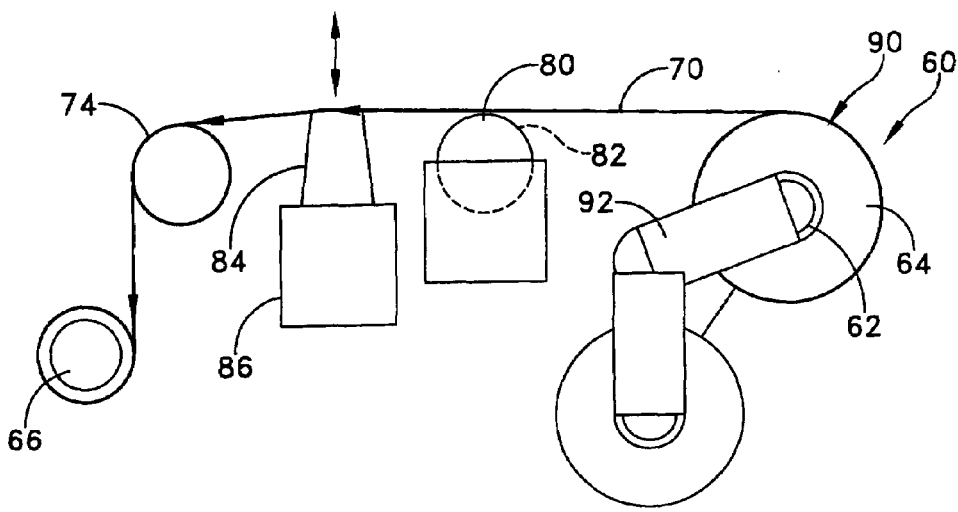
FIG. 8 shows a diagrammatic representation of the quick-change web material module depicted in the change or replace position.
Figure 7:
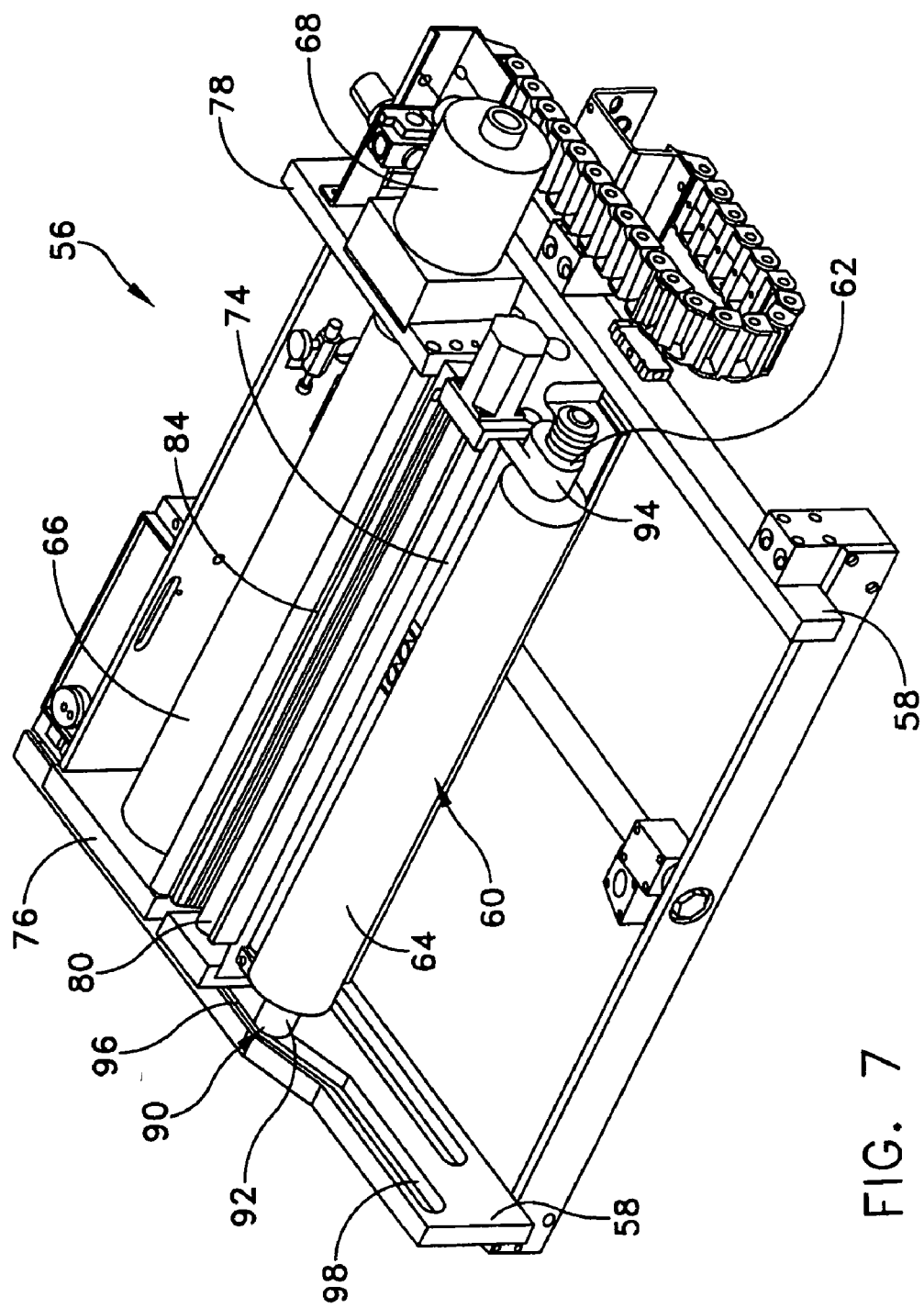
FIG. 7 shows a perspective view of the stencil wiper apparatus having the quick-change web material module depicted in a change or replace position.

FIGS. 7 and 8 illustrate the movement of the supply roller 62 from the operating position shown in FIGS. 5 and 6 in which the paper module 60 functions to wipe the stencil 36 to a changing position in which the supply roller 62 is accessible to change the roll of paper 64. The module 60 includes a pivot mechanism, generally indicated at 90, for pivoting the supply roller 62 between its operating and changing positions. Specifically, the pivot mechanism 90 includes at least one and preferably a pair of arms 92, 94 that enable the pivot action of the supply roller 62. One end of each pivot arm 92, 94 is rotatably attached to the supply roller 62 in any suitable manner, e.g., bearings, at the end of the supply roller 62. The other (opposite) end of each pivot arm 92, 94 is pivotably attached to its respective frame member 76, 78 in a similar manner. As shown in FIGS. 5 and 6, during operation of the stencil wiper assembly 56 to clean a stencil 36, the supply roller 62 is disposed below the guide roller 74, solvent tube 80 and stencil wiper 84. In this position, it is difficult, if not impossible, to replace an existing, used-up roll of paper 64 with a new roll of paper. When depleted, the supply roller 62 can be pivoted counterclockwise in the manner illustrated in FIG. 8, to move the supply roller 62 in a position that is easily accessible for changing. This reduces cycle time as well as the frustration level of the operator having to replace the roll of paper 64.

Figure 9:
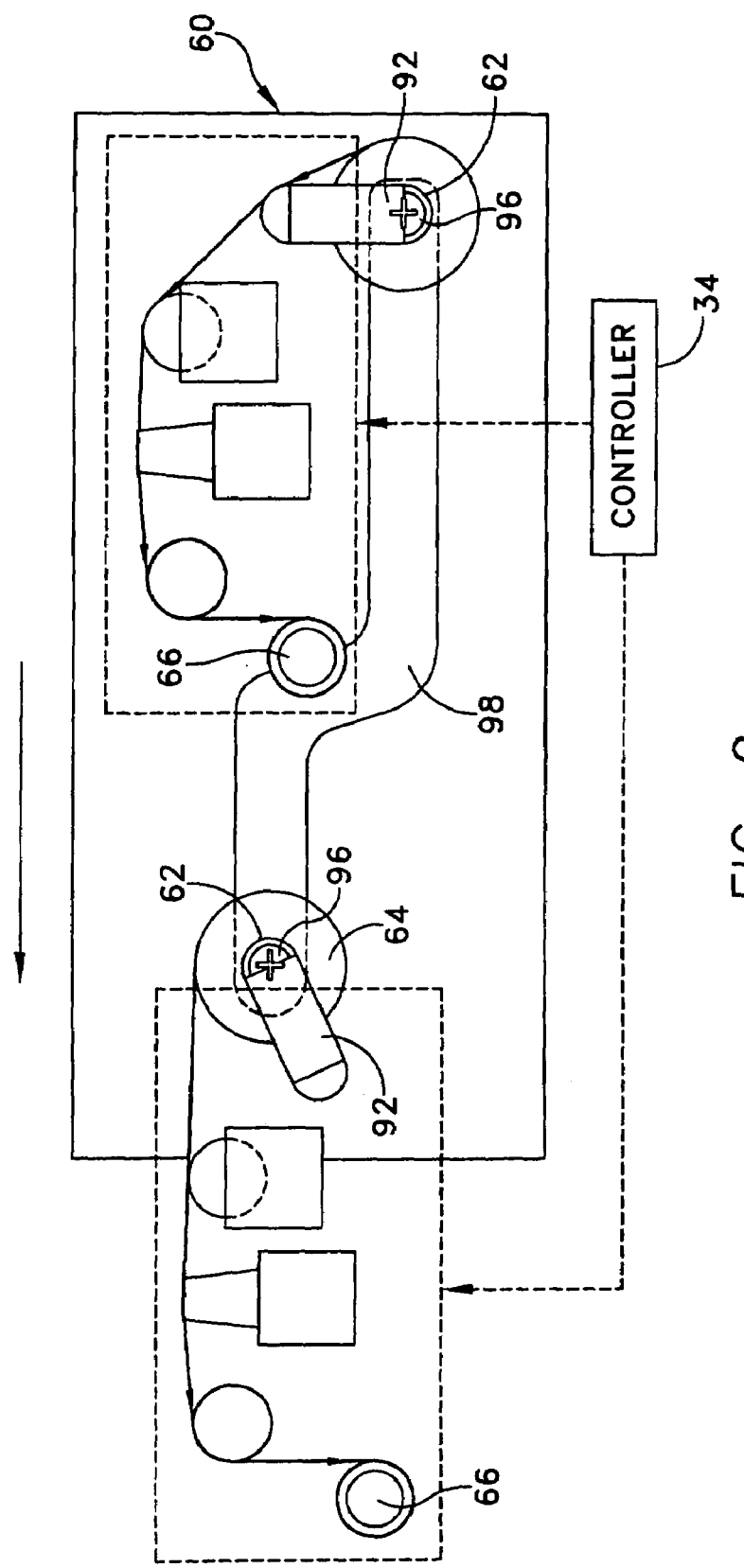
FIG. 9 shows a diagrammatic representation of the quick-change web material module moving from the operating position to the changing position.
Figure 10:
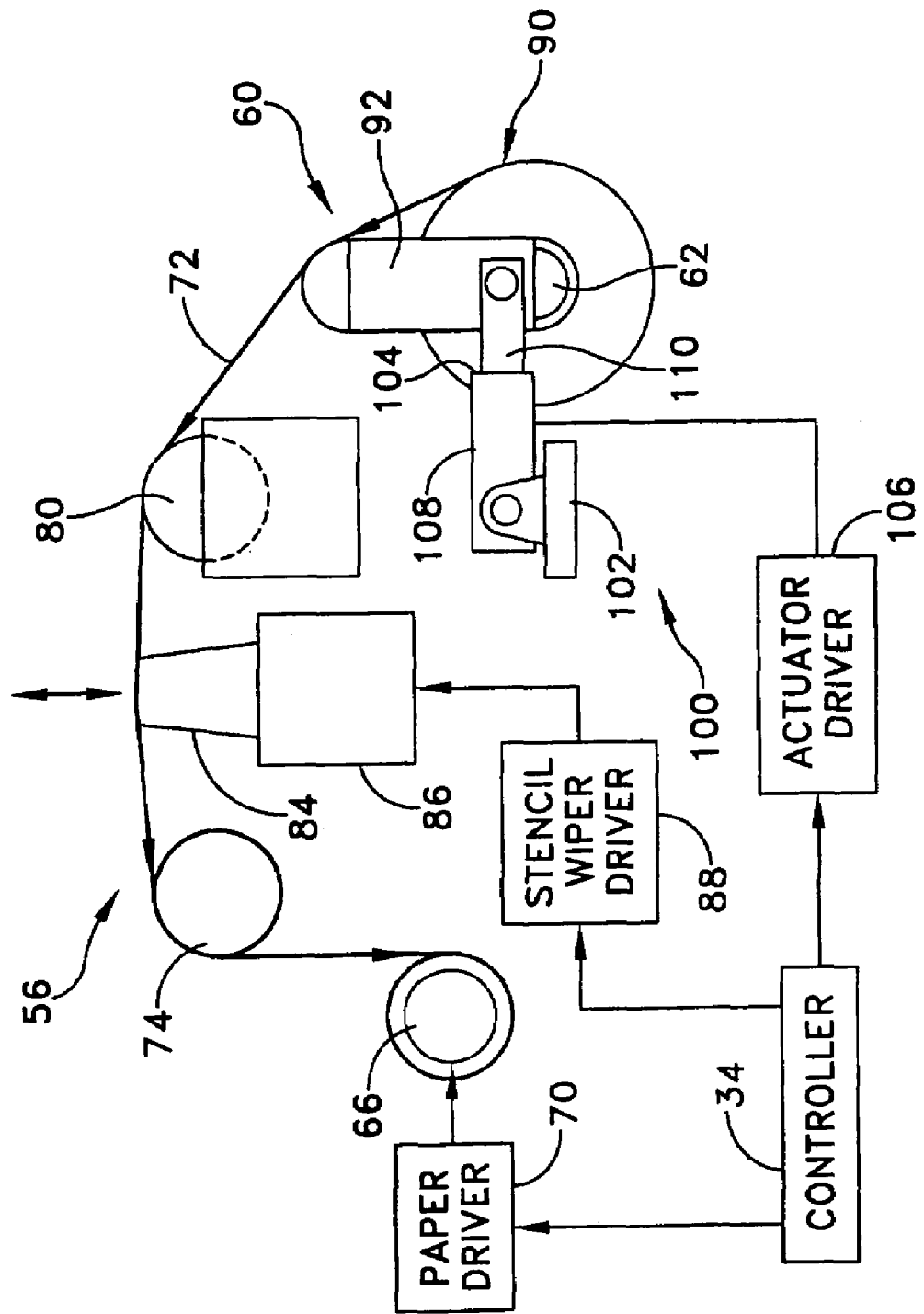
FIG. 10 shows an enlarged diagrammatic representation of a quick-change web material module of another embodiment of the present invention.

FIGS. 9 and 10 illustrate two approaches in moving the supply roller 62 between its operating and changing positions. As shown in FIG. 9, the paper module 60 is capable of pivoting between its operating and changing positions by moving the stencil wiper assembly 56 from the operating position in which the paper module is illustrated in the far-right position to the changing position in which the paper module 60 is illustrated in the far-left position. To achieve this movement, a cam member 96 is provided on one end of the supply roller 62. Alternatively, the cam member 96 can be formed on the pivot arm 92 (or 94). The cam member 96 is received in a cam slot 98, which can be formed in rail 58 or, alternatively, mounted on the rail 58 in any suitable manner. As most clearly shown in FIG. 9, the cam slot extends generally horizontally and elevates at its middle portion to effect the upward movement of the cam member 96. The arrangement is such that as controller 34 moves the paper module 60 from right to left as illustrated in FIG. 9, the cam member 96 follows along in the cam slot 98 thereby pivoting the pivot mechanism 90 counterclockwise to dispose the supply roller 62 in its changing position. The movement of the paper module 60 is effected by a sliding mechanism associated with frame members 76, 78 that interact with rails 58.

As can be readily appreciated, the stencil wiper assembly 56 is designed to enable an operator to quickly and easily replace the roll of paper 64. Another benefit of this design is that since the supply roller 62 is tucked underneath the plane of the solvent tube 80, stencil wiper 84 and guide roller 74 during the operating position, the stencil wiper assembly is more compact. Thus, the overall footprint of the stencil printer 30 is reduced.

After moving the supply roller 62 to its changing position, the depleted roll of paper 64 can be easily removed by sliding the supply roller 62 axially in a direction to enable one of the ends of the supply roller to be removed from a snap-fit bearing (not shown) housed within one of the arms 92, 94. This movement enables the supply roller 62 to be completely removed from the quick-change paper module 60 without the need of tools or other complicated manipulation of the module. The take-up roller 66 may be removed from the module 60 in a similar manner to that of the supply roller 62 to remove used paper from the take-up roller.

Referring now to FIG. 10, there is illustrated an alternate embodiment of the present invention. As shown, at least one actuator, generally indicated at 100, is provided for effecting the pivot of the supply roller 62 between its operating and changing positions. The actuator 100 includes a base 102 suitably secured to the frame member 76 or 78 and a piston assembly 104 activated by the controller 34 through an actuator driver 106. More specifically, a cylinder portion 108 of the piston assembly 104 is pivotably attached to the base 102 while a piston portion 110 is pivotably attached to the pivot arm 92. Suitable hydraulic or pneumatic controls can be provided to move the piston portion 110 between a retracted position in which it is housed within the cylinder portion 108 and an extended position in which it extends from the cylinder portion 108. During operation, the controller 34 sends a signal to the actuator driver 106 to extend the piston portion 110 from the cylinder portion 108 thereby pivoting the pivot arm 92 counterclockwise. This action of the piston assembly 104 moves the supply roller 62 from the operating position to the changing position.

It should be understood that any appropriate mechanism can be employed for effecting the movement of the supply roller 62 between its operating and changing positions and still fall within the scope of the present invention. The cam member 96 and cam slot 98 arrangement and the actuator 100 are examples of mechanisms that may be employed to effect this movement.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A quick-change material module of a stencil wiper assembly for wiping a stencil of a stencil printer, the module comprising:
    a supply roller to receive a roll of material;
    a take-up roller to receive used material;
    a drive to move the material across the stencil between the supply roller and the take-up roller;
    a frame to support the supply roller, the take-up roller, and the drive; and
    at least one pivot arm having one end rotatable attached to the supply roller and an opposite end pivotably attached to the frame;
    wherein the supply roller pivots between an operating position in which the module functions to wipe the stencil and a changing position in which the supply roller is accessible to change the roll of material.

2. The module set forth in claim 1, further comprising a cam member provided on one end of the supply roller and a cam slot provided on the frame to receive the cam member therein.

3. The module set forth in claim 2, the frame being constructed and arranged to enable the module to move linearly with respect to the wiper assembly, the cam member following along in the cam slot upon movement of the module to pivot the supply roller from the operating position to the changing position.

4. The module set forth in claim 1 further comprising an actuator for effecting the pivoting of the supply roller between the operating and changing positions.

5. The module set forth in claim 4, the actuator comprising a piston assembly having one end pivotably attached to the pivot arm and an opposite end secured to the frame.

6. The module set forth in claim 1, further comprising a fluid delivery assembly for wetting the material.

7. A method for changing a roll of material within a quick-change material module of a stencil wiper assembly designed to wipe a stencil of a stencil printer, the method comprising:
    moving the material between a supply roller and a take-up roller; and
    pivoting the supply roller having one end rotatably attached to the supply roller and an opposite end pivotably attached to a frame of the stencil wiper assembly between an operating position in which the module functions to wipe the stencil and a changing position in which the supply roller is accessible to change the roll of material.

8. The method set forth in claim 7 further comprising changing the roll of material.

9. A stencil printer comprising:
    a stencil;
    a material applicator to apply material on the stencil; and
    a stencil wiper assembly to selectively wipe the stencil, the stencil wiper assembly having a quick-change material module comprising
        a supply roller to receive a roll of paper,
        a take-up roller to receive used paper,
        a drive to move paper across the stencil between the supply roller and the take-up roller,
        a frame to support the supply roller, the take-up roller and the drive,
        at least one pivot arm having one end rotatable attached to the supply roller and an opposite end pivotably attached to the frame, and
        means for pivoting the supply roller between an operating position in which the module functions to wipe the stencil and changing position in which the supply roller is accessible to change the roll of paper.

10. The stencil printer set forth in claim 9, further comprising a cam member provided on one end of the supply roller and a cam slot provided on the frame to receive the cam member therein.

11. The stencil printer set forth in claim 10, the frame being constructed and arranged to enable the module to move linearly with respect to the wiper assembly, the cam member following along in the cam slot upon movement of the module to pivot the supply roller from the operating position to the changing position.

12. The stencil printer set forth in claim 9, further comprising an actuator for effecting the pivoting of the supply roller between the operating and changing positions.

13. The stencil printer set forth in claim 12, the actuator comprising a piston assembly having one end pivotably attached to the pivot arm and an opposite end secured to the frame.

* * * * *

UNITED STATES PATENT AND TRADEMARK OFFICE
CERTIFICATE OF CORRECTION

PATENT NO.         : 7,017,489 B2
APPLICATION NO. : 10/784122
DATED                  : March 28, 2006
INVENTOR(S)       : Joseph A. Perault et al.

It is certified that error appears in the above-identified patent and that said Letters Patent is hereby corrected as shown below:

In the specification:
Page 1, Column 1, line 43, after "standard cartridge.", please insert the following paragraphs:

--In some prior art stencil printers, any excess solder paste remaining under the squeegee after it has fully traversed the stencil, remains on the stencil when the squeegee is returned to its initial position for printing on a second circuit board. Usually, as the squeegee passes the solder paste over the apertures, minute amounts of solder paste seep through the apertures to accumulate at the bottom side of the stencil. This presents various problems such as the solder paste being inadvertently disposed on the unintended areas of the circuit boards. Also, as the solder paste hardens, it complicates the alignment procedure of a circuit board with the stencil. Also, such hardened solder paste may jeopardize the quality of subsequent printing operations. Therefore, it is highly desirable to remove the excess solder paste that forms on the bottom of the stencil.

U.S. Patent No. 5,918,544 to Doyle represents one prior art stencil printer having a well-known method and apparatus for cleaning the bottom of the stencil. Doyle discloses a wiping system that is positioned near the vicinity of the stencil and moves beneath the stencil from one end of the stencil to the other end. As the stencil wiper system moves beneath the stencil, it wipes off excess solder paste at the bottom of the stencil.

Figure 2:
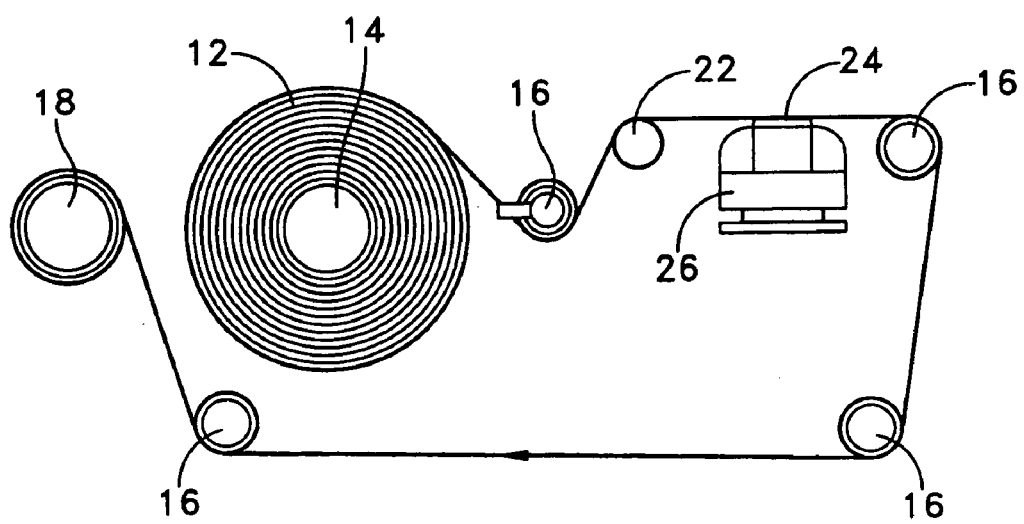
FIG. 2 shows a diagrammatic representation of the prior art stencil wiper apparatus illustrated in FIG. 1.

FIGS. 1 and 2 disclose such a prior art stencil wiper system, generally indicated at 10. As shown, a paper supply of a prior art stencil wiper system 10 includes a roll of

UNITED STATES PATENT AND TRADEMARK OFFICE
CERTIFICATE OF CORRECTION

| | | |
|---|---|---|
| PATENT NO. | : 7,017,489 B2 | |
| APPLICATION NO. | : 10/784122 | |
| DATED | : March 28, 2006 | |
| INVENTOR(S) | : Joseph A. Perault et al. | |

It is certified that error appears in the above-identified patent and that said Letters Patent is hereby corrected as shown below:

<u>In the specification</u>: (continued)
Page 1, Column 1, line 43, after "standard cartridge.", please insert the following paragraphs:

paper 12 housed on a supply roller 14, several paper guide rollers 16, a take-up roller 18 for receiving used paper, and a paper or web material driver 20 for moving the paper across the stencil in a linear direction from the supply roller 14 to the take-up roller 18. The stencil wiper system 10 further includes a hollow solvent tube 22 with numerous small openings formed along the length of the tube 22, and a wiper blade 24 having a vacuum plenum 26 for removing excess moisture and hardened solder paste from the paper as it travels underneath the stencil. The wiper blade 24 moves the web between a position in which the paper is spaced away from the stencil and a position in which the paper engages the stencil. During a cleaning operation, a paper winder motor of the web material driver 20 rotates the take-up roller 18 (and paper supply roller 14), which passes paper through the paper guide rollers 16. Between the paper guide rollers 16 there is the hollow solvent tube 22 that is filled with solvent by a solvent pump, which causes the solvent tube 22 to squirt solvent through its numerous holes onto the paper as it passes the solvent tube 22.

UNITED STATES PATENT AND TRADEMARK OFFICE
CERTIFICATE OF CORRECTION

PATENT NO. : 7,017,489 B2
APPLICATION NO. : 10/784122
DATED : March 28, 2006
INVENTOR(S) : Joseph A. Perault et al.

It is certified that error appears in the above-identified patent and that said Letters Patent is hereby corrected as shown below:

<u>In the specification</u>: (continued)
Page 1, Column 1, line 43, after "standard cartridge.", please insert the following paragraphs:

The solvent impregnated paper is passed over the wiper blade 24, which holds the paper in place as the stencil moves over the paper, thereby cleaning the stencil.--

Signed and Sealed this

Fifteenth Day of May, 2007

JON W. DUDAS
*Director of the United States Patent and Trademark Office*